(12) United States Patent
Masuda et al.

(10) Patent No.: US 8,038,972 B2
(45) Date of Patent: Oct. 18, 2011

(54) HIGHER ORDER SILANE COMPOSITION, METHOD FOR MANUFACTURING FILM-COATED SUBSTRATE, ELECTRO-OPTICAL DEVICE AND ELECTRONIC DEVICE

(75) Inventors: Takashi Masuda, Nomi (JP); Makoto Kato, Suwa (JP); Hideki Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 125 days.

(21) Appl. No.: 11/972,306

(22) Filed: Jan. 10, 2008

(65) Prior Publication Data

US 2009/0155454 A1 Jun. 18, 2009

(30) Foreign Application Priority Data

Jan. 18, 2007 (JP) ................................ 2007-009566

(51) Int. Cl.
*C01B 33/04* (2006.01)
*C04B 41/50* (2006.01)
*C04B 35/00* (2006.01)
*B05D 3/02* (2006.01)

(52) U.S. Cl. ................ 423/347; 106/287.1; 252/62.3 R; 252/62.3 Q; 427/387

(58) Field of Classification Search .................. 423/347, 423/391, 405, 447; 252/62.3 R, 62.3 Q; 427/58, 427/384, 385.5, 387; 106/285, 287.1
See application file for complete search history.

(56) References Cited

U.S. PATENT DOCUMENTS

| | | | | |
|---|---|---|---|---|
| 5,358,987 | A | * | 10/1994 | Kanai et al. ................... 524/254 |
| 6,025,117 | A | * | 2/2000 | Nakano et al. ................ 430/314 |
| 2003/0045632 | A1 | * | 3/2003 | Shiho et al. ................... 524/861 |
| 2006/0145306 | A1 | * | 7/2006 | Lee et al. ...................... 257/643 |
| 2006/0198966 | A1 | * | 9/2006 | Kaino et al. ................... 427/595 |

FOREIGN PATENT DOCUMENTS

| | | |
|---|---|---|
| JP | A-06-191821 | 7/1994 |
| JP | A-2000-031066 | 1/2000 |
| JP | A-2003-313299 | 11/2003 |
| JP | A-2003-318119 | 11/2003 |
| JP | A-2004-186320 | 7/2004 |
| JP | A-2005-219981 | 8/2005 |
| JP | A-2006-256918 | 9/2006 |

OTHER PUBLICATIONS

O'Neil, Maryadele J. et al. The Merck Index—An Encyclopedia of Chemicals, Drugs, and Biologicals (14th Edition—Version 14.3): Indene and Tetrahydronaphthalene.*

* cited by examiner

*Primary Examiner* — Jerry A Lorengo
*Assistant Examiner* — Carlos Barcena
(74) *Attorney, Agent, or Firm* — Oliff & Berridge, PLC

(57) ABSTRACT

A higher order silane composition, includes: a higher order silane compound; and a solvent containing one of a substituted hydrocarbon based solvent and an unsubstituted hydrocarbon based solvent. As the solvent, a solvent having a refractive index of 1.53 or more is selected so that the higher order silane compound is dissolved therein.

21 Claims, No Drawings

HIGHER ORDER SILANE COMPOSITION, METHOD FOR MANUFACTURING FILM-COATED SUBSTRATE, ELECTRO-OPTICAL DEVICE AND ELECTRONIC DEVICE

The entire disclosure of Japanese Patent Application No. 2007-009566, filed Jan. 18, 2007 is expressly incorporated by reference herein.

BACKGROUND

1. Technical Field

The present invention relates to a higher order silane composition, a method for manufacturing a film-coated substrate, an electro-optical device, and an electronic device.

2. Related Art

A pattern of a silicon film (an amorphous silicon film, a polycrystalline silicon film, for example) being applied for an integrated circuit, a thin film transistor, and the like is generally formed in such process that after a silicon film is formed on a whole surface of a substrate by a vapor phase process such as chemical vapor deposition (CVD), unnecessary part is removed by photolithography.

However, the method above employs the vapor phase process, so that the method has disadvantages such as necessity for a large-scale device, inefficiency in a material use, difficulty in handling vapor material, and generation of large amount of waste.

Therefore, a method for forming a silicon film by a liquid phase process has been researched, and the following method is disclosed in JP-A-2003-313299, for example. In the method, a higher order silane composition containing a liquid silane compound (cyclopentasilane, for example), a higher order silane compound, and a solvent is applied on a substrate. Then the solvent is removed and a heat treatment is conducted so as to form a silicon film. The higher order silane compound is obtained by irradiating the liquid silane compound with ultraviolet rays so as to photopolymerize the compound. Examples of the solvent include decalin, toluene, decane, octane, xylene, and benzene.

Here, the higher order silane compound has low resolvability with respect to a solvent employed for the higher order silane composition. That is, the solvent employed for the higher order silane composition independently can not solve enough amount of higher order silane compound therein to form a silicon film.

On the other hand, the higher order silane compound is soluble with respect to the liquid silane compound (lower order silane compound), and the lower order silane compound is soluble with respect to the solvent described above.

Therefore, the higher order silane composition disclosed in JP-A-2003-313299 allows a lower order silane compound soluble to the solvent to exist therein as an unreacted substance so as to keep such state that the higher order silane compound is dissolved within the solvent. It can be considered that the higher order silane compound is dissolved in a mixed solvent containing the solvent above and the lower order silane compound, in this higher silane composition.

If a content rate of the higher order silane compound is made high in such the higher order silane composition, a content rate of the lower order silane compound also needs to be made high. However, the lower order silane compound has high oxygen activity and has high vapor pressure, so that the mixed solvent disadvantageously becomes unstable. In order to improve the stability of the mixed solvent, the content rate of the lower order silene compound needs to be made low, but enough amount of higher order silene compound to form a film having a desired thickness can not dissolved in the mixed solvent containing the lower order silane compound in low content rate.

Therefore, development of such solvent that has preferable stability and can dissolve enough amount of higher order silane compound to form a film having a desired film thickness has been required.

SUMMARY

An advantage of the present invention is to provide a higher order silane composition with which a film having a stable and desired film thickness can be formed by the vapor phase process; a method for manufacturing a film-coated substrate that is manufactured with the higher order silane composition; an electro-optical device including the film-coated substrate; and an electronic device including the film-coated substrate.

The invention is achieved as follows.

A higher order silane composition according to a first aspect of the invention, includes: a higher order silane compound; and a solvent containing one of a substituted hydrocarbon based solvent and an unsubstituted hydrocarbon based solvent. As the solvent, a solvent having a refractive index of 1.53 or more is selected so that the higher order silane compound is dissolved therein.

Accordingly, the higher order silane composition by which a film having a stable and desired film thickness can be formed by a vapor phase process is obtained.

In the higher order silane composition of the first aspect, the higher order silane compound may be expressed by a general formula: —$(SiH_2)_n$— where "n" in the formula denotes an integer number of 8 or more.

Thus, even if "n" of the formula of the higher order silane compound is 8 or more, the higher order silane compound can be dissolved in the solvent of which a refractive index is 1.53 or more.

In the higher order silane composition of the first aspect, a concentration of the higher order silane compound in the higher order silane composition may be 1 wt. % to 50 wt. %.

The concentration of the range prevents uneven deposition of the higher order silane compound in the higher order silane composition. Consequently, a homogeneous film having even film thickness can be surely obtained.

In the higher order silane composition of the first aspect, the solvent may be a single solvent of the hydrocarbon based solvent.

Using the single solvent of the hydrocarbon based solvent facilitates handling of the solvent, improving stability of the higher order silane composition.

In the higher order silane composition of the first aspect, the solvent may be a mixed solvent containing the hydrocarbon based solvent.

Accordingly, a refractive index of the mixed solvent can be adjusted with relative ease.

In the higher order silane composition of the first aspect, the mixed solvent may contain a silicon based solvent as well as the hydrocarbon based solvent.

The silicon based solvent has relatively large cohesive energy and large refractive index so as to be suitably used especially when the refractive index of the mixed solvent is adjusted.

In the higher order silane composition of the first aspect, the hydrocarbon based solvent may have a dielectric constant of 10 or less.

Selecting the solvent having the dielectric constant of 10 or less improves the dispersibility of the higher order silane compound with respect to the solvent so as to be able to surely dissolve the higher order silane compound in the solvent.

In the higher order silane composition of the first aspect, the hydrocarbon based solvent may include a double bond in a molecule thereof.

Then the refractive index of the hydrocarbon based solvent can be surely increased. A solvent having a double bond is easily obtainable, is inexpensive, and has excellent stability so as to be preferably used.

In the higher order silane composition of the first aspect, the hydrocarbon based solvent may include an aromatic ring in a molecule thereof.

The aromatic ring includes especially stable double bonds, so that a hydrocarbon based solvent including the aromatic ring has a large refractive index and an excellent stability.

In the higher order silane composition of the first aspect, the hydrocarbon based solvent may contain one of halogen, nitrogen, and sulfur as a substituent group in a molecule thereof.

Then the refractive index of the hydrocarbon based solvent can be surely increased.

In the higher order silane composition of the first aspect, the hydrocarbon based solvent may be a compound expressed by Formula 1:

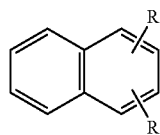

Formula 1 in which two "R"s denote an alkyl group and have one of same chain lengths and different lengths from each other.

Such compound has a refractive index of 1.60 or more and a dielectric constant of 3 or less, so that even higher order silane compound having large molecular weight can be further surely dissolved in the solvent.

A method for manufacturing a film-coated substrate according to a second aspect of the invention, includes: (a) preparing the higher order silane composition according to the first aspect; (b) supplying the higher order silane composition to a substrate so as to form a liquid film thereon; and (c) removing the solvent from the liquid film so as to obtain a film containing the higher order silane compound.

By the method, a film having an even and desired film thickness can be formed with the use of the liquid phase process.

In the step (a) of the method of the second aspect, the higher order silane composition may be obtained such that after a liquid silane compound is polymerized in a solution containing the liquid silane compound so as to generate the higher order silane compound, the higher order silane compound that is extracted from the solution is dissolved in the solvent.

Thus the higher order silane composition containing the higher order silane compound that is isolated from the liquid silane compound can be prepared.

The method of the second aspect further includes: (d) conducting at least one of a heat treatment and a light irradiation treatment with respect to the film in a non-oxidizing atmosphere to change the higher order silane compound into silicon and thus obtaining a silicon film containing silicon after the step (c).

The silicon film having a desired film thickness can be thus formed by the liquid phase process.

The method of the second aspect further includes: (e) conducting at least one of a heat treatment and a light irradiation treatment with respect to the film in an oxidizing atmosphere to change the higher order silane compound into oxidized silicon and thus obtaining an oxidized silicon film containing oxidized silicon after the step (c).

The oxidized silicon film having a desired film thickness can be thus formed by the liquid phase process.

An electro-optical device according to a third aspect of the invention, includes: a film-coated substrate manufactured by the method for manufacturing a film-coated substrate according to the second aspect.

The electro optical device with high reliability can be thus provided.

An electronic device according to a fourth aspect of the invention, includes: the electro-optical device of the third aspect.

Thus, the electronic device having high reliability can be obtained.

DESCRIPTION OF EXEMPLARY EMBODIMENT

A higher order silane composition, a method for manufacturing a film-coated substrate, an electro-optical device, and an electronic device according to an embodiment of the invention will now be described.

Higher Order Silane Composition

A higher order silane composition according to the present embodiment of the invention will be described.

The higher order silene composition contains a higher order silane compound (polysilane) and a solvent dissolving the higher order silane compound.

The higher order silane compound is expressed in a general formula —$(SiH_2)_n$— of which n (number of atoms) is mainly 8 or more. The higher order silane compound is solid at normal temperature and normal pressures and changes to amorphous silicon by firing (heat treatment).

As long as the higher order silane compound maintains its solid state at normal temperature and normal pressures, the general formula thereof may include a few of "n"s being 7 or less (lower order silane described later).

In the general formula of the higher order silane compound, "n" (average value) is preferably from about 10 to about 3000, more preferably from about 50 to about 1000. A melting point, a boiling point, and adhesiveness to a substrate of the higher order silane compound, and further, wettability with respect to a substrate and viscosity of a higher order silane composition including the higher order silane compound depend on a magnitude of "n". As "n" is large (that is, molecular weight is large), the melting point, the boiling point, and the adhesiveness to a substrate of the higher order silane compound and the viscosity of the higher order silane composition tend to increase, and activity of the higher order silane composition with respect to oxygen tends to decrease.

Therefore, with the higher order silane compound of which the general formula includes "n" being in the range described above (the higher order silane compound having large molecular weight), a film having even film thickness and homogeneity can be surely formed in a film forming process described later. Further, since the higher order silane compound having large molecular weight has low reactivity, it is easily handled.

It is preferable that the boiling point of the higher order silane compound be higher than a decomposition temperature thereof. Therefore, when the higher order silane compound is fired and changed to amorphous silicon so as to obtain a silicon film, the higher order silane compound can be prevented from evaporating and disappearing before the amorphous silicon is sufficiently produced.

Here, if the higher order silane compound of which the boiling point is higher than the decomposition temperature, it decomposes before reaching the boiling point, being not able to measure the boiling point.

Therefore, the "boiling point" in the embodiment means a boiling point (at normal pressures) as a theoretical figure derived from temperature dependence of vapor pressure and a theoretical calculation.

The present embodiment of the invention employs a solvent containing a substituted or unsubstituted hydrocarbon-based solvent and having a refractive index of 1.53 or more. In the embodiment, the refractive index of the solvent denotes a value with respect to NaD line (an average wavelength $\lambda=598.26$ nm) at the temperature of 20 degrees Celsius ($N_D^{20}$).

Here, the higher order silane compound expressed by the general formula —$(SiH_2)_n$— has disadvantageously low resolvability with respect to a solvent, such as decalin, toluene, decane, octane, xylene, and benzene, that is preferably employed for dissolving straight chained saturated hydrocarbon expressed, for example, by a general formula —$(CH_2)$—.

It can be considered that the low resolvability of the higher order silane compound is caused by that a carbon atom in a molecular architecture thereof is substituted for a silicon atom, compared to straight chained saturated hydrocarbon.

That is, a size [$\upsilon$] of the atom included in the molecular architecture has a proportional relation to electronic polarizability [$\alpha_o$] as expressed by Formula 1 below ($\in_o$ denotes a dielectric constant in vacuum, in the formula).

$$\alpha_o/4\pi\in_o \propto \upsilon \quad \text{Formula 1}$$

Further, the electronic polarizability [$\alpha_o$] has a proportional relation to cohesive energy [U] (London dispersion force [$w(r)_{London}$]) acting between two identical particles as expressed by Formula 2 (I denotes a first ionization potential, $\in_o$ denotes a dielectric constant in vacuum, and r denotes a distance between the particles, in the formula).

$$U=w(r)_{London}=-3/4\cdot\alpha_o I/(4\pi\in_o)^2 r^6 \quad \text{Formula 2}$$

Accordingly, the size [$\upsilon$] of an atom and the cohesive energy [U] has a proportional relation with each other. Thus the following can be considered. Since a carbon atom in the molecular architecture is substituted for a silicon atom to increase the size of the atom, the cohesive energy in the molecular architecture is increased, causing the low resolvability of the higher order silane compound. Here, the formula is known as London equation.

Here, in terms of force acting between substances of which a dielectric constant is small, in particular the value of the dielectric constant is 10 or less, the influence of the molecular polarizability is enough small to be ignored, compared to the influence of the electronic polarizability. Therefore, it can be considered that the cohesive energy is equal to London dispersion force derived from the electronic polarizability.

The relation between electronic polarizability [$\alpha_o$] and the refractive index [n] satisfies Formula 3, so that it can be determined that if the refractive index is large, the electronic polarizability and the cohesive energy are large ($\in_o$ denotes dielectric constant, M denotes molecular weight, $\rho$ denotes density, and $N_o$ is Avogadro constant, in the formula). Here, the formula is known as Lorentz-Lorenz equation.

$$\alpha_o=3\in_o M/\rho N_o(n^2-1/n^2+2) \quad \text{Formula 3}$$

Further, dispersion self-energy [$\Delta\mu_{dispersion}$] of the higher order silane compound with respect to the solvent, that is, a change of chemical potential in dissolving the higher order silane compound to the solvent has a relation expressed by Formula 4. In Formula 4, the cohesive energy and the refractive index of the higher order silane compound are respectively denoted as $U_1$ and $n_1$ and the cohesive energy and the refraction index of the solvent are respectively denoted as $U_2$ and $n_2$. Thus, it was found that as the difference between the refractive index of the higher order silane compound and that of the solvent decreases, the dispersion self-energy of the higher order silane compound decreases.

$$\Delta\mu_{dispersion} \propto -(\sqrt{U_1}-\sqrt{U_2})^{2\propto} -(n_1^2-n_2^2)^2 \quad \text{Formula 4}$$

Namely, it was found that a solvent of which the refractive index is close to that of the higher order silane compound needs to be selected in order to dissolve a substance having a small dielectric constant like the higher order silane compound in the solvent.

If n is 8 or more in the general formula —$(SiH_2)_n$—, the refractive index of the higher order silane compound is about 1.64 though being changed depending on its molecular weight. As a result of the inventor's keen research in terms of the solubility of the higher order silane compound to a solvent having close refractive index of 1.64, the inventor found that the higher order silane compound (n is 8 or more in the general formula —$(SiH_2)_n$—) can suitably be dissolved in a solvent that has the refractive index of 1.53 or more.

Further, the following was found. If a solvent containing a hydrocarbon based solvent is selected among solvents whose refractive indices are 1.53 or more, handling of the solvent is facilitated due to the low activity of the hydrocarbon based solvent, being able to improve the stability of the higher order silane composition.

It is enough that the refractive index of such solvent is 1.53 or more, but it is preferably 1.54 or more, more preferably 1.60 or more. If a solvent whose refractive index is smaller than the lower limit described above, the higher order silane compound can not be dissolved in the solvent. Especially, if a solvent whose refractive index is 1.54 or more is selected, the higher order silane compound (n is 100 or more, in the general formula —$(SiH_2)_n$—) can be surely dissolved. If a solvent whose refractive index is 1.60 or more is selected, solubility of the higher order silane compound, of which the formula includes n of 100 or more, with respect to the solvent can be further improved. It is preferable that the upper limit of the refractive index of the solvent be 1.70 or less. A solvent whose refractive index is more than 1.70 is not a liquid matter at normal temperature or difficult to be obtained, so that the upper limit of the refractive index of the solvent is preferably 1.70 or less.

The solvent may be a single solvent of a substituted or unsubstituted hydrocarbon based solvent and may be a mixed single solvent containing a hydrocarbon based solvent. Using the single solvent of the hydrocarbon based solvent facilitates the handling of the solvent, improving the stability of the higher order silane composition. Either, using the mixed solvent containing the hydrocarbon based solvent can make the adjustment of the refractive index of the mixed solvent relatively easy.

The hydrocarbon based solvent may be a polar solvent, but it is preferably a non-polar solvent. Accordingly, the dispersibility of the higher order silane compound with respect to the solvent improves, being able to surely dissolve the higher order silane compound in the solvent.

The polarity of the solvent can be expressed by a dielectric constant of the solvent. The dielectric constant of the non-polar solvent is preferably 10 or less, more preferably 7 or less, and furthermore preferably about 1 to 3. Employing a non-polar solvent having a dielectric constant within such range can improve the dispersibility of the higher order silane compound with respect to the non-polar solvent.

Here, the hydrocarbon based solvent preferably includes a halogen group as a substituent group or a double bond in its molecule in terms of increasing its refractive index. Thus the refractive index of the hydrocarbon based solvent can be surely increased. A solvent having a double bond is easily obtained, is inexpensive, and has excellent stability so as to be preferably used.

In particular, examples of the non-polar hydrocarbon based solvent including a halogen group and having a refractive index of 1.53 or more preferably include: 1,2-dibromoethane (1.5358), and examples including a halogen group and having a refractive index of 1.54 or more preferably include: 1-chloronaphthalene (1.6326); 2,3-dichlorotoluene (1.5511); 2,4-dichlorotoluene (1.5480); 2,5-dichlorotoluene (1.5449); 2,6-dichlorotoluene (1.5501); 3,4-dichlorotoluene (1.5471); 3,5-dichlorotoluene (1.5438); m-dichlorobenzene (1.5434); o-dichlorobenzene (1.5492); tribromomethane (1.6005); 1,1,2,2-tetrabromoethane (1.6353); o-dibromobenzene (1.6155); m-dibromobenzene (1.6063); tetrabromoethane (1.6363); 1,2,4-trichlorobenzene (1.5693); 1-bromonaphthalene (1.6588); and bromobenzene (1.5602). These may be used singularly or may be used in combination (numerals in parentheses show refractive indices of respective solvents).

Examples of the non-polar hydrocarbon based solvent including a double bond in its molecule and having the refractive index of 1.53 or more preferably include: methyl salicylate (1.5353), and examples including a double bond in its molecule and having the refractive index of 1.54 or more preferably include: thioanisole (1.5842); o-fluoroaniline (1.5420); m-fluoroaniline (1.5450); p-fluoroaniline (1.5400); 1,2-dimethylnaphthalene (1.6105); 1,3-dimethylnaphthalene (1.6127); 1,4-dimethylnaphthalene (1.6120); 1,6-dimethylnaphthalene (1.6072); styrene (1.5440); ethyl cinnamate (1.5590); benzyl salicylate (1.5805); aniline (1.5862); quionoline (1.6268); N,N diethylaniline (1.5420); N,N-dimethylaniline (1.5584); o-toluidine (1.5728); m-toluidine (1.5711); N-methylaniline (1.5714); diphenylether (1.5826); benzyl benzoate (1.5681); and dihydronaphthalene (1.5722). These may be used singularly or may be used in combination (numerals in parentheses show refractive indices of respective solvents).

The hydrocarbon based solvent including a double bond preferably includes an aromatic ring in its molecule. The aromatic ring includes especially stable double bonds, so that a hydrocarbon based solvent including the aromatic ring has a large refractive index and an excellent stability.

The aromatic ring may have an alkyl group such as a methyl group and an ethyl group as a constituent group. Thus the solvent can enhance asymmetry within its molecule and make the aromatic ring to which a substituent group is introduced have a liquid state at room temperature.

In consideration of the above, that is, in consideration of the refractive index of the solvent and the magnitude of the dielectric constant, a compound expressed by Formula 2 is preferably selected as the hydrocarbon based solvent. Such compound has a refractive index of 1.60 or more and a dielectric constant of 3 or less, so that even higher order silane compound having large molecular weight can be surely dissolved in the solvent.

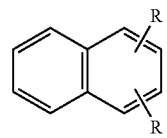

Formula 2

Two "R"s in the formula express an alkyl group. They may have the same chain length or a different chain length from each other. They are preferably a methyl group.

In particular, examples of such hydrocarbon based solvent include: 1,2-dimethylnaphthalene (1.6105); 1,3-dimethylnaphthalene (1.6127); 1,4-dimethylnaphthalene (1.6120); and 1,6-dimethylnaphthalene (1.6072) among the above substances.

Such hydrocarbon based solvent dissolve the higher order silane compound singularly or in mixed manner. Therefore, the higher order silane composition does not include a lower order silane compound that is precursor of a higher order silane compound, in a higher order silane compound preparation process described later. The lower order silane compound is used when the higher order silane compound is obtained by polymerization reaction. Accordingly, the stability of the higher order silane composition can be improved while maintaining high solubility of the higher order silane compound with respect to the solvent, so that a film having a desired film thickness can be formed with relative ease.

Further, if a solvent having a refractive index of 1.53 or more is used as a mixed solvent, a solvent contained other than the hydrocarbon based solvent is not limited but is preferably a silicon based solvent. The silicon based solvent has relatively large cohesive energy and a large refractive index so as to be suitably used especially when the refractive index of the mixed solvent is adjusted.

Examples of the silicon based solvent include: bis(indenyl)dimethylsilane (1.6110); bromomethyltrimethylsilane (1.5670); bromophenyltrichlorosilane (1.5670); t-butyldiphenylchlorosilane (1.5680); t-butyldiphenylcyanosilane (1.5600); chlorophenyltrichlorosilane (1.5418); diallyldiphenylsilane (1.5750); dichlorophenyltrichlorosilane (1.5640); diethyldiphenylsilane (1.5605); dimethyldiphenylsilane (1.5594); diphenylchlorosilane (1.5810); diphenyldichlorosilane (1.5819); diphenyldimethoxysilane (1.5447); diphenyldivinylsilane (1.5780); diphenylmethylchlorosilane (1.5742); diphenylmethylethoxysilane (1.5440); diphenylmethylsilane (1.5694); diphenylmethylvinylsilane (1.5669); diphenylsilane (1.5795); hexaphenyldisiloxane (1.6800); phenylethynyldimethylsilane (1.5407); (phenylselenomethyl)trimethylsilane (1.5520); tetrabromosilane (1.5627); tetraphenoxysilane (1.5540); 1,1,5,5-tetraphenyl-1,3,3,5-tetramethyltrisiloxane (1.5510); vinyldiphenylchlorosilane (1.5790); vinyldiphenylethoxysilane (1.5489); and vinyltriphenoxysilane (1.5620). These may be used singularly or in combination (numerals in parentheses show refractive indices of respective solvents).

In addition, a lower order silane compound that is precursor of a higher order silane compound may be used as the silicon based solvent in a higher order silane compound preparation process described later. The lower order silane compound is used when the higher order silane compound is obtained by polymerization reaction.

The ratio between the hydrocarbon based solvent and the silicon based solvent in the higher order silane composition is not limited, but is preferably about 99:1 to about 80:20 in volume ratio, more preferably about 95:5 to about 90:10.

Setting the ratio between the hydrocarbon based solvent and the silicon based solvent to be within the above range facilitates the handling of the mixed solvent and facilitates the adjustment of the refractive index of the mixed solvent.

Here, various additives may be added to such higher order silane composition if required.

The additives may be a substance containing a group 3B element in the periodic table or a substance (dopant source) containing a group 5B element in the periodic table. Adding such substances can provide a silicon film to which those elements are doped, namely, an n-type silicon film and a p-type silicon film.

The concentration of the dopant source in the higher order silane composition is adequately selected depending on the dopant concentration finally required in the silicon film to be obtained.

The substance containing the group 3B element in the periodic table and the substance (dopant source) containing the group 5B element in the periodic table are a substance containing elements such as phosphorus, boron, and arsenic, and may be a substance disclosed in JP-A-2000-31066, for example.

Further, a minute amount of surface tension regulating agent may be added as other additives without adversely affecting the function of the film made of the higher order silane composition. The surface tension regulating agent may be fluorine based, silicone based, nonionic based, and the like. Adding these surface tension regulating agents enhances the wettability of the higher order silane composition with respect to a substrate, improves the leveling property of a liquid film formed on the substrate, and prevents the occurrence of minute bumps and an orange peel-like surface of the film.

Method for Manufacturing Film-Coated Substrate

Now described will be a method for manufacturing a film-coated substrate according to the embodiment of the invention with the higher order silane composition described above.

In the method for manufacturing a film-coated substrate, a higher order silane composition containing a higher order silane compound is applied to a substrate so as to form a liquid film, and then a predetermined treatment is performed with respect to the liquid film so as to form a desired film. The method includes [1] a higher order silane composition preparing process, [2] a higher order silane composition supplying process, [3] a solvent removing process, and [4] a post-treatment process.

Now, each process will be described below sequentially.

[1] Higher Order Silane Composition Preparing Process

First, a higher order silane composition containing a higher order silane compound and a solvent that dissolves the higher order silane compound is prepared.

[1-1] A higher order silane compound is provided at first.

The higher order silane compound is expressed by the general formula —$(SiH_2)_n$— as described above and is solid at normal temperature. A method for preparing the higher order silane compound is not limited. The higher order silane compound may be manufactured such that a lower order silane compound that is a precursor of the higher order silane compound is used as a starting material and is polymerized.

In the embodiment, the lower order silane compound is such compound that it is polymerized to provide a higher order silane compound and commonly is in a liquid state at normal temperature and normal pressures (hereinafter, also referred to as a "liquid silane compound").

Such lower order silane compound (precursor) may be a compound that is polymerized by light irradiation, electron beam irradiation and heating, for example, to be a higher order silane compound. Especially the lower order silane compound that changes to a higher order silane compound (a compound having photopolymerizability) by light irradiation (especially ultraviolet irradiation) is preferably used. Using such lower order silane compound as a starting material can provide a higher order silane compound having relatively large molecular weight. Further, the molecular weight of the higher order silane compound to be obtained is controlled with relative ease.

The lower order silane compound that is polymerized (photopolymerized) by the ultraviolet irradiation is, for example, a compound that is expressed by a general formula $Si_nX_m$ (n and m respectively denote independent integer numbers that are 3 or more and 4 or more, and X denotes a substituent group such as a hydrogen atom and/or a halogen atom).

Especially, it is preferable to use a ring compound expressed by a general formula $Si_nX_{2n}$, a compound containing two or more of ring structures expressed by a general formula $Si_nX_{2n-2}$, and silicon hydride and halogen substitution of the silicon hydride that have at least one ring structure in their molecules. In terms of the general formula $Si_nX_{2n}$, n denotes an integer number that is 3 or more, and X denotes a hydrogen atom and/or a halogen atom. In terms of the general formula $Si_nX_{2n-2}$, n denotes an integer number that is 4 or more, and X denotes a hydrogen atom and/or a halogen atom.

Examples of the lower order silane compound having single-ring structure include: cyclotrisilane; cyclotetrasilane; cyclopentasilane; cyclohexasilane; and cycloheptasilane, and examples having double-ring structure include: 1,1'-bicyclobutasilane; 1,1'-bicyclopentasilane; 1,1'-bicyclohexasilane; 1,1'-bicycloheptasilane; 1,1'-cyclobutasilylcyclopentasilane; 1,1'-cyclobutasilylcyclohexasilane; 1,1'-cyclobutasilylcycloheptasilane; 1,1'-cyclopentasilylcyclohexasilane; 1,1'-cyclopentasilylcycloheptasilane; 1,1'-cyclohexasilylcycloheptasilane; spiro[2,2]pentasilane; spiro[3,3]heptasilane; spiro[4,4]nonasilane; spiro[4,5]decasilane; spiro[4,6]undecasilane; spiro[5,5]undecasilane; spiro[5,6]undecasilane; and spiro[6,6]tridecasilane. Such silane compounds that part of a skeleton of the above compounds is substituted for a $SiH_3$ group or a halogen atom are also available. These compounds may be used singularly or in combination. These lower order silane compounds have quite high reactivity with respect to light so as to be able to photopolymerize efficiently.

Among these, compounds expressed by $Si_nX_{2n}$ such as cyclotetrasilane, cyclopentasilane, cyclohexasilane, and cycloheptasilane are preferable. In the formula, n denotes an integer number that is 3 or more and X denotes a halogen atom such as a hydrogen atom and/or a fluorine atom, a chlorine atom, a bromine atom, and an iodine atom. These lower order silane compounds are especially preferable in view of facility of combining and refining as well as the above reasons.

The lower order silane compounds may contain silane compounds such as n-pentasilane, n-hexasilane, and n-heptasilane; and modified silane compounds modified by a boron atom and/or a phosphorus atom as long as the photopolymerizing process by ultraviolet irradiation is not adversely affected.

Examples of a solvent included to a solution that polymerizes the lower order silane compound include: a hydrocarbon based solvent such as n-hexane, n-heptane, n-octane, n-decane, dicyclopentane, benzene, toluene, xylene, durene, indene, tetrahydronaphthalene, decahydronaphthalene, and squalane; an ether based solvent such as dipropylether, ethyleneglycoldimethylether, ethyleneglycoldiethylether, ethyleneglycolmethylethylether, diethyleneglycoldimethylether, diethyleneglycoldiethylether, diethyleneglycolmethylethylether, tetrahydrofuran, tetrahydropyran, 1,2-dimethoxyethane, bis(2-methoxyethyl)ether, and p-dioxane; and a polar solvent such as propylencarbonate, γ-butyrolactone, N-methyl-2-pyrrolidone, dimethylformamide, acetonitrile, and dimethylsulfoxide. These may be used singularly or in combination.

It is preferable that the ultraviolet rays with which the lower order silane compound is irradiated be light that can surely polymerize the lower order silane compound and has a wavelength not dissolving the solvent described above. Here, the "wavelength not dissolving the solvent" means a wavelength with which chemical bonds in a molecule of the solvent are not cut by the irradiation of the ultraviolet rays.

The wavelength of the ultraviolet rays is preferably 200 nm or more, more preferably 250 nm or more. With the ultraviolet rays having a wavelength within such range, the precursor can surely polymerized, and as mentioned later, an impurity atom such as a carbon atom derived from the solvent can be prevented from entering a higher order silane compound that is in a solid state when the higher order silane compound is isolated. Accordingly, deterioration of a film to be formed with the higher order silane compound can be prevented.

The molecular weight distribution of the higher order silane compound can be controlled by the irradiation time, the irradiation amount, and the irradiation method of the ultraviolet rays.

The irradiation time of the ultraviolet rays is preferably about 0.1 seconds to about 120 minutes, more preferably about 1 minute to about 30 minutes. Irradiation with the ultraviolet rays in such irradiation time can provide a higher order silane compound having a distribution peak in an appropriate range of the n-number (molecular weight) described above, that is, a higher order silane compound having an appropriate molecular weight distribution.

In a case where the higher order silane compound is isolated from a solution containing the higher order silane compound obtained by polymerization of the lower order silane compound, the following method is executed, for example.

That is, in a case where the higher order silane compound is dissolved in the solution, the higher order silane compound can be isolated (isolated and purified) by size exclusion chromatography (SEC). If the higher order silane compound is deposited from the solution, the higher order silane compound that is deposited can be isolated by filtration using a microfilter, for example. Namely, the higher order silane compound can be isolated from the solution in which the lower order silane compound remains.

[1-2] The higher order silane compound is dissolved in a solvent containing a hydrocarbon based solvent so as to prepare the higher order silane composition according to the embodiment of the invention.

Here, the embodiment selects a solvent having a refractive index of 1.53 or more. Therefore, even though a higher order silane compound that is in a solid state at normal temperature and normal pressures is used, enough amount of higher order silane compound to form a higher order silane compound film can be surely dissolved in the solvent, in a solvent removing process [3] described later.

The concentration (contained amount) of the higher order silane compound contained in the higher order silane composition slightly changes depending on a desired film thickness, but the concentration is preferably from about 1 to 50 wt. %, more preferably about 1 to 30 wt. %. Setting the concentration of the higher order silane compound to be in the above range prevents uneven deposition of the higher order silane compound in the higher order silane composition. Consequently, a homogeneous film having even film thickness can be surely obtained. Further, the concentration of the higher order silane compound is adequately set within the above range, being able to make the higher order silane compound film have a desired film thickness.

The higher order silane compound prepared as above preferably has a viscosity (at normal temperature) of about 0.5 to about 100 mPa·s, more preferably about 3 to about 50 mPa·s. Thus, a film having sufficient and even film thickness can be obtained.

The viscosity of the higher order silane composition can be adjusted by the molecular weight dispersion and the concentration of the higher order silane compound, and kinds of the solvent.

[2] Higher Order Silane Composition Supplying Process

The higher order silane composition that is prepared is supplied on a substrate so as to form a liquid film.

Examples of the substrate include: a quarts substrate; a glass substrate such as a borosilicate glass, and a soda glass; a metal substrate such as a transparent electrode like ITO, gold, silver, copper, nickel, titanium, aluminum, and tungsten; a glass substrate having these metals or their oxide on its surface; and a plastic substrate.

A method for supplying the higher order silane composition can be spin coating, roll coating, curtain coating, dip coating, spraying, and droplet discharging.

The droplet discharging is such method that a droplet of the higher order silane composition is discharged on a desired area so as to form a liquid film of the higher order silane composition as a desired pattern.

In the droplet discharging, the higher order silane composition may be sprayed or may be discharged one droplet by one droplet sequentially, when it is discharged.

The number of revolutions of a spinner used in the spin coating changes depending on a desired film thickness and a composition of the higher order silane composition, but it is preferably about 100 to about 5000 rpm, more preferably about 300 to about 3000 rpm.

The higher order silane composition is preferably supplied at a temperature within a range where the higher order silane composition is not solidified or deposited. The higher order silane composition can be suitably supplied at the temperature within the range.

The processes described above are preferably performed under an atmosphere where contents of water and oxygen are reduced with the solvent and the additive of which contents of water and oxygen are reduced. If the contents of water and oxygen of the atmosphere, the solvent, and the additive are reduced, the higher order silane compound can be surely prevented from being modified by reacting with water and oxygen.

Further, the processes are more preferably performed under an atmosphere where an inert gas such as nitrogen, helium, and argon is present. In addition, a reducing gas such as hydrogen may be mixed in the atmosphere as necessary. Accordingly the higher order silane compound can be surely prevented from being modified.

[3] Solvent Removing Process

The substrate that is provided with the liquid film made of the higher order silane composition is heated so as to remove the solvent from the liquid film, forming a film made of the higher order silane compound (a higher order silane compound film) on the substrate.

The heating temperature is adequately set depending on a kind of the solvent, the atmosphere, and the like so as to efficiently vapor and remove the solvent. The adequate setting of the heating temperature can preferably prevent uneven film thickness of a film to be obtained and an element derived from the solvent from remaining as an impurity.

The heating temperature of the substrate is preferably about 100 to 300 degrees Celsius, and more preferably about 180 to 280 degrees Celsius.

The substrate is preferably heated under an atmosphere of an inert gas such as nitrogen, helium, argon; or a non-oxidizing atmosphere such as a reduced pressure state. Thus the higher order silane compound can be surely prevented from being modified.

Here, as described above, the liquid film before an unnecessary component thereof is removed contains the solvent having superior (dominant) wettability so as to show preferable wettability with respect to the substrate.

[4] Post-Treatment Process

A post-treatment is performed to the higher order silane compound film that is formed, in accordance with a purpose. With the post-treatment, a silicon film or an oxidized silicon film can be obtained from the higher order silane compound film (hereinafter, occasionally referred to as simply "a film").

For example, a heat treatment and/or a light irradiation treatment are/is conducted to the film in a non-oxidizing atmosphere so as to change the higher order silane compound to silicon. Thus a silicon film mainly made of silicon can be obtained.

In a case where the higher order silane composition to which dopant is added is used, the dopant is activated by the heat treatment and/or the light irradiation treatment.

The light irradiation treatment is performed at a higher temperature than the decomposition temperature of the higher order silane compound. Thus the higher order silane compound is decomposed to be silicon.

The crystallinity of the silicon film to be obtained can be controlled by the temperature of the heat treatment.

For example, if the heat treatment is performed with the reaching temperature of over 550 degrees Celsius, a silicon film in a polycrystalline state (a polycrystalline silicon film) can be obtained.

In a case where the heat treatment is performed with the reaching temperature of 550 degrees Celsius or less, a silicon film in an amorphous state (an amorphous silicon film) can be obtained. In particular, the reaching temperature is preferably about 250 to 450 degrees Celsius, and more preferably about 300 to 400 degrees Celsius. In a case where the reaching temperature is less than the lower limit of the above range, the heat decomposition of the higher order silane compound is not advanced sufficiently. Therefore, the higher order silane compound is disadvantageously oxidized when it is put in the atmosphere.

The heating time is not limited, but it is preferably about 10 to 120 minutes, more preferably about 30 to 60 minutes.

The non-oxidizing atmosphere may be an atmosphere of inert gas such as nitrogen, helium, and argon; and be a reducing atmosphere such as hydrogen.

After the amorphous silicon film is formed, the light irradiation treatment is conducted to the film, being able to provide a polycrystalline silicon film (a polysilicon film).

Examples of a light source used here include: a low-pressure or high-pressure mercury lamp; a deuterium lamp; a discharge light of a noble gas such as argon, krypton, and xenon; YAG laser; argon laser; carbon dioxide gas laser; and excimer laser such as XeF, XeCl, XeBr, KrF, KrCl, ArF, and ArCl. Among these, the laser lights are preferably used. Thus the amorphous silicon film can be efficiently poly-crystallized.

The output power of these light sources is preferably about 10 to 5000 W, and more preferably about 100 to 1000 W.

Wavelengths of these light sources are not limited as long as the higher order silane compound absorbs them even a little, but wavelengths of about 170 to 60 nm are preferably employed.

A temperature in the light irradiation treatment is commonly from room temperature to about 1500 degrees Celsius, and is preferable to be adequately selected depending on a semiconductor property of a desired silicon film.

Further, the heat treatment is conducted to the silicon film that is obtained (an amorphous silicon film, a polycrystalline silicon film) in an oxidizing atmosphere so as to change the silicon to oxidized silicon, being able to provide an oxidized silicon film mainly made of oxidized silicon. Such oxidized silicon film is subjected to the heat treatment and/or the light irradiation treatment in an oxidizing atmosphere so as to change the higher order silane compound to oxidized silicon. Thus an oxidized silicon film mainly made of oxidized silicon can also be obtained. In this case, the film that has been in the non-oxidizing atmosphere is not rapidly exposed to the oxidizing atmosphere, but the film is preferably exposed such that the oxidizing atmosphere is gradually mixed in the non-oxidizing atmosphere.

In this case, the heating temperature is preferably about 300 to about 550 degrees Celsius, more preferably about 350 to about 500 degrees Celsius.

The heating time is not limited, but it is preferably about 10 to about 120 minutes, more preferably about 30 to about 60 minutes.

Through the processes above, such film-coated substrate (the film-coated substrate of the embodiment of the invention) is manufactured that the higher order silane compound film, the silicon film, and the oxidized silicon film are formed thereon.

Such method for manufacturing a film-coated substrate employs a liquid phase process (liquid process), so that it has advantages such as unnecessary for a large-scale device, efficiency in material use, easiness in handling the material because it is liquid, and little waste generation.

The method for manufacturing a film-coated substrate described above can be applicable to, for example, forming a channel, a source, and a drain in a transistor, forming a silicon film to be used for an optical sensor, manufacturing a solar cell, and manufacturing a semiconductor element substrate that includes semiconductor elements and is used in various ways.

A film-coated substrate manufactured by the method for manufacturing a film-coated substrate according to the embodiment of the invention is applicable to an electro-optical device and an electronic device.

The electro-optical device here is, for example, a device provided with a liquid crystal element, an electrophoretic element including a dispersion medium in which an electrophoretic particle is dispersed, an EL element, and the like; and includes the semiconductor element substrate applied to a driving circuit and the like.

The electronic device indicates common devices including a film-coated substrate manufactured by the method for manufacturing a film-coated substrate according to the embodiment of the invention and performing a certain function, and includes an electro-optical device and a memory.

The structure of the electronic device is not limited and examples of the electronic device include: an integrated circuit (IC) card, a cellular phone, a video camera, a personal computer, a head mounted display, a rear or front projector, further, a fax machine with a display function, a finder of a digital camera, a portable TV, a digital signal processing (DSP) device, a personal digital assistance (PDA), a personal organizer, an electronic billboard, and a display for advertising.

While the higher order silane composition, the method for manufacturing a film-coated substrate, the electro-optical device, and the electronic device according to the embodiments of the invention are described above, the invention is not limited to the above.

For example, to the method for manufacturing a film-coated substrate according to the present invention, one or more of processes of desired purposes can be added, if necessary.

EXAMPLES

Specific examples of the invention will now be described.

Hereafter, each treatment was conducted under a nitrogen atmosphere having 1 ppm oxygen concentration, unless it is specifically mentioned.

Examples

1. Preparation of Higher Order Silane Composition
(Sample No. 1A)

<1A> First, 3 g cyclopentasilane (boiling point: 194 degrees Celsius) as a lower order silane compound was dissolved in 10 mL benzene so as to prepare a cyclopentasilane solution.

<2A> Second, the cyclopentasilane solution was put in a glass beaker and was irradiated with ultraviolet rays having a wavelength of 254 nm and an intensity of 50 mW/cm² for five minutes while being stirred. Thus the cyclopentasilane was polymerized, precipitating a higher order silane compound in the solution.

<3A> Third, the precipitate in the solution was filtered with a 0.5 μm microfilter so as to separate and obtain the higher order silane compound.

<4A> Then the higher order silane compound was dissolved in a mixed solution (refractive index: 1.6106) of structural isomers of dimethylnaphthalene so as to obtain a higher order silane composition of Sample No. 1A.

The concentration of the higher order silane compound in the higher order silane composition was 30 wt. %.

Further, in a formula —$(SiH_2)_n$— expressing the higher order silane compound, n (average value) was 90.

(Sample No. 2A)

A higher order silane composition of Sample No. 2A was obtained through the same processes as those of Sample No. 1A except for irradiating with ultraviolet rays having a wavelength of 254 nm and an intensity of 100 mW/cm² for 10 minutes in the process <2A>.

The concentration of the higher order silane compound in the higher order silane composition was 20 wt. %.

Further, in the formula —$(SiH_2)_n$— expressing the higher order silane compound, n (average value) was 200.

(Sample No. 3A)

A higher order silane composition of Sample No. 3A was obtained through the same processes as those of Sample No. 1A except for dissolving the higher order silane compound by o-fluoroaniline (1.5420) in the process <4A>.

The concentration of the higher order silane compound in the higher order silane composition was 10 wt. %.

Further, in the formula —$(SiH_2)_n$— expressing the higher order silane compound, n (average value) was 90.

(Sample No. 4A)

A higher order silane composition of Sample No. 4A was obtained through the same processes as those of Sample No. 1A except for irradiating with ultraviolet rays having a wavelength of 254 nm and an intensity of 100 mW/cm² for 10 minutes in the process <2A> and dissolving the higher order silane compound by o-fluoroaniline (1.5420) in the process <4A>.

The concentration of the higher order silane compound in the higher order silane composition was 5 wt %. It was shown that the content rate of the higher order silane compound tends to be lower than that of the higher order silane composition of Sample No. 2A.

Further, in the formula —$(SiH_2)_n$— expressing the higher order silane compound, n (average value) was 200.

(Sample No. 5A)

A higher order silane composition of Sample No. 5A was obtained through the same processes as those of Sample No. 1A except for dissolving the higher order silane compound by 1,2-dibromoethane (1.5358) in the process <4A>.

The concentration of the higher order silane compound in the higher order silane composition was 1 wt. %. It was shown that the content rate of the higher order silane compound tends to be lower than that of the higher order silane composition of Sample No. 1A.

Further, in the formula —$(SiH_2)_n$— expressing the higher order silane compound, n (average value) was 90.

(Sample No. 6A)

A higher order silane composition of Sample No. 6A was obtained through the same processes as those of Sample No. 1A except for dissolving the higher order silane compound by a mixed solvent of 1,2-dibromoethane (1.5358) and bis(indenyl)dimethylsilane (1.6110) in the process <4A>.

In terms of the mixed solvent, the weight ratio between 1,2-dibromoethane and bis(indenyl)dimethylsilane was 90:10, and the refractive index of the mixed solvent was 1.5423.

The concentration of the higher order silane compound in the higher order silane composition was 10 wt. %.

Further, in the formula —$(SiH_2)_n$— expressing the higher order silane compound, n (average value) was 90.

(Sample No. 7A)

Though the same processes were carried out as those of Sample No. 1A except for irradiating with ultraviolet rays having a wavelength of 254 nm and an intensity of 100 mW/cm² for 10 minutes in the process <2A> and using 1,2-dibromoethane (1.5358) as a solvent for dissolving the higher order silane compound in the process <4A>, the higher order silane compound could not be dissolved in the solvent.

Here, in the formula —$(SiH_2)_n$— expressing the higher order silane compound, n (average value) was 200.

(Sample No. 8A)

Though the same processes were carried out as those of Sample No. 1A except for using anisole (1.5160) as a solvent for dissolving the higher order silane compound in the process <4A>, the higher order silane compound could not be dissolved in the solvent.

Here, in the formula —$(SiH_2)_n$— expressing the higher order silane compound, n (average value) was 90.

2. Manufacture of Silicon Film-Coated Substrate and Oxidized Silicon Film-Coated Substrate Here, 10 each of silicon film-coated substrates of each sample number and 10 each of oxidized silicon film-coated substrates of each sample number were manufactured.

Each numeric number of measured results shown below is an average value of the 10 substrates.

(Sample No. 1B)

<1B> First, the higher order silane composition of Sample No. 1 was applied to a quartz substrate by spin coating at 1500 rpm so as to form a liquid film thereon.

<2B> Second, the substrate provided with the liquid film was heated at 270 degrees Celsius for 30 minutes to be dried. Thus a higher order silane compound film was obtained.

<3B> Third, a heat treatment was conducted to the higher order silane compound film that was obtained at 350 degrees Celsius for 60 minutes.

Accordingly, a liver color film was obtained.

A result of measuring the film by Raman spectroscopy showed that this film was an amorphous silicon film. In addition, as a result of analyzing the amorphous silicon film (measuring surface compositions) by secondary-ion mass spectrometry (SIMS), the amorphous silicon film was mainly composed of silicon atoms and includes 2% oxygen, 0.1% carbon, and 0.1% each of other metal atoms as impurities.

<4B> Next, the amorphous silicon film that was obtained was irradiated with excimer laser having 308 nm wavelength at 300 mJ/cm$^2$ energy concentration in the atmosphere (at room temperature).

Thus, a polycrystalline silicon film was obtained.

A result of measuring the polycrystalline silicon film by Raman spectroscopy showed that the crystallization rate of the film was 95%.

Thus the silicon film-coated substrate of Sample No. 1B was manufactured.

(Samples No. 2B to 6B)

Silicon film-coated substrates of Samples No. 2B to 6B were manufactured in the same manner as Sample No. 1B except for respectively using higher order silane compositions of Samples No. 2A to 6A in the process <1B>.

(Samples No. 7B and 8B)

Since higher order silane compounds could not be dissolved in solvents in terms of higher order silane compositions of Samples No. 7A and 8A, forming film-coated substrates by using these samples was omitted.

(Samples No. 1C to 6C)

After the same treatment as the Samples No. 1B to 6B were conducted with respect to Samples No. 1C to 6C until higher order silane compound films were obtained through processes <1B> and <2B>, air was introduced gradually into a chamber under a nitrogen atmosphere so as to make the inside of the chamber be an air atmosphere in 30 minutes.

Then instead of the process <4B>, the substrates were fired at 400 degrees Celsius for 60 minutes in the air. Accordingly, transparent and colorless films were obtained.

Results of ESCA analysis with respect to these films showed that each film was an oxidized silicon film of which a ratio between silicon and oxygen was about 1:2.

Further, results of SIMS analysis with respect to these oxidized silicon films showed that each of the films contains 0.1% carbon and less than 0.1% each of other metal atoms as impurities.

Thus, the oxidized silicon film-coated substrates of Samples No. 1C to 6C were manufactured.

3. Assessment of Silicon Film-Coated Substrate and Oxidized Silicon Film-Coated Substrate Film thicknesses of the silicon film-coated substrates and the oxidized silicon film-coated substrates of each sample number were measured at 10 points at each of the substrates with an optical interference type film thickness meter. Then an average film thickness of each of the substrates was derived.

Table 1 shows the average film thickness that was measured of the substrate of each sample number.

TABLE 1

| | Higher order silane compound | | | |
|---|---|---|---|---|
| | Average value of n | Concentration in higher order silane compound | Refractive index of solvent | Film thickness [nm] |
| Sample No. 1B | 90 | 30 wt. % | 1.6106 | 190 |
| Sample No. 2B | 200 | 20 wt. % | 1.6106 | 360 |
| Sample No. 3B | 90 | 10 wt. % | 1.5420 | 60 |
| Sample No. 4B | 200 | 5 wt. % | 1.5420 | 92 |
| Sample No. 5B | 90 | 1 wt. % | 1.5358 | 15 |
| Sample No. 6B | 90 | 10 wt. % | 1.5423 | 70 |
| Sample No. 1C | 90 | 30 wt. % | 1.6106 | 210 |
| Sample No. 2C | 200 | 20 wt. % | 1.6106 | 400 |
| Sample No. 3C | 90 | 10 wt. % | 1.5420 | 75 |
| Sample No. 4C | 200 | 5 wt. % | 1.5420 | 108 |
| Sample No. 5C | 90 | 1 wt. % | 1.5358 | 22 |
| Sample No. 6C | 90 | 10 wt. % | 1.5423 | 88 |

As shown in Table 1, as the refractive index of the solvent included to the higher order silane composition is large, a higher order silane compound having a large average of "n"s can be dissolved in higher concentration. Silicon films and oxidized silicon films made of such higher order silane compositions have larger film thicknesses.

As a result of measuring film thicknesses at 10 points on each of the silicon film-coated substrates of Samples No. 1B to 6B and the oxidized silicon film-coated substrates of Samples No. 1C to 6C (present invention), the film thicknesses were almost even (±5% variation with respect to the average film thicknesses).

What is claimed is:

1. A higher order silane composition, comprising:
   a higher order silane compound; and
   a solvent including at least one hydrocarbon based solvent selected from the group consisting of dimethylnaphthalene, o-fluoroaniline, and 1,2-dibromoethane,
   the solvent having a refractive index of more than 1.60.

2. The higher order silane composition according to claim 1, wherein a concentration of the higher order silane compound in the higher order silane composition is 1 wt. % to 50 wt. %.

3. The higher order silane composition according to claim 1, wherein the solvent is a single solvent of the hydrocarbon based solvent.

4. The higher order silane composition according to claim 1, wherein the solvent is a mixed solvent containing the hydrocarbon based solvent.

5. The higher order silane composition according to claim 4, wherein the mixed solvent contains a silicon based solvent as well as the hydrocarbon based solvent.

6. The higher order silane composition according to claim 1, wherein the hydrocarbon based solvent has a dielectric constant of 10 or less.

7. The higher order silane composition according to claim 1, wherein the higher order silane compound is a compound expressed by a general formula: —(SiH$_2$)$_n$—, an average value of n being 50 to 1000.

8. The higher order silane composition according to claim 1, wherein the higher order silane compound is a compound expressed by a general formula: —(SiH$_2$)$_n$—, the n being a natural number.

9. The higher order silane composition according to claim 1, the higher order silane compound being a compound expressed by a general formula: —$(SiH_2)_n$—, an average value of n being 10 to 3000.

10. The higher order silane composition according to claim 1, the higher order silane compound being a compound expressed by a general formula: —$(SiH_2)_n$—, an average value of n being 90 to 200.

11. A higher order silane composition, comprising:
   a higher order silane compound; and
   a solvent including at least one hydrocarbon based solvent selected from the group consisting of dimethylnaphthalene, o-fluoroaniline, and 1,2-dibromoethane,
      the higher order silane compound being a compound expressed by a general formula: —$(SiH_2)_n$—, an average value of n being 90 to 200.

12. The higher order silane composition according to claim 11, the solvent including dimethylnaphthalene.

13. The higher order silane composition according to claim 11, the solvent including o-fluoroaniline.

14. The higher order silane composition according to claim 11, the solvent including 1,2-dibromoethane.

15. The higher order silane composition according to claim 11, the solvent further including bis(indenyl)dimethylsilane.

16. A method for manufacturing a film-coated substrate, comprising:
   (a) preparing the higher order silane composition according to claim 1;
   (b) supplying the higher order silane composition to a substrate so as to form a liquid film thereon; and
   (c) removing the solvent from the liquid film so as to obtain a film containing the higher order silane compound.

17. The method for manufacturing a film-coated substrate according to claim 16, wherein in the step (a), the higher order silane composition is obtained such that after a liquid silane compound is polymerized in a solution containing the liquid silane compound so as to generate the higher order silane compound, the higher order silane compound that is extracted from the solution is dissolved in the solvent.

18. The method for manufacturing a film-coated substrate according to claim 16, further comprising:
   (d) conducting at least one of a heat treatment and a light irradiation treatment with respect to the film in a non-oxidizing atmosphere to change the higher order silane compound into silicon and thus obtaining a silicon film containing silicon, after the step (c).

19. The method for manufacturing a film-coated substrate according to claim 16, further comprising:
   (e) conducting at least one of a heat treatment and a light irradiation treatment with respect to the film in an oxidizing atmosphere to change the higher order silane compound into oxidized silicon and thus obtaining an oxidized silicon film containing oxidized silicon, after the step (c).

20. An electro-optical device, comprising: a film-coated substrate manufactured by the method for manufacturing a film-coated substrate according to claim 16.

21. An electronic device, comprising: the electro-optical device according to claim 20.

* * * * *